(12) United States Patent
Windhorn

(10) Patent No.: US 6,657,395 B2
(45) Date of Patent: Dec. 2, 2003

(54) CLOSE COUPLED MATCH STRUCTURE FOR RF DRIVE ELECTRODE

(75) Inventor: Thomas H. Windhorn, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/364,409

(22) Filed: Feb. 12, 2003

(65) Prior Publication Data

US 2003/0141825 A1 Jul. 31, 2003

Related U.S. Application Data

(63) Continuation of application No. PCT/US01/24571, filed on Aug. 7, 2001.
(60) Provisional application No. 60/225,743, filed on Aug. 17, 2000.

(51) Int. Cl.$^7$ .................................................. H01J 7/24
(52) U.S. Cl. ............................. 315/111.21; 315/111.51; 118/723 IR
(58) Field of Search ...................... 315/111.21, 111.51; 118/723 E, 723 I, 723 IR

(56) References Cited

U.S. PATENT DOCUMENTS

| | | |
|---|---|---|
| 4,990,859 A | 2/1991 | Bouyer et al. |
| 5,302,882 A | 4/1994 | Miller |
| 5,325,019 A | 6/1994 | Miller et al. |
| 5,710,486 A * | 1/1998 | Ye et al. .................. 315/111.21 |
| 5,747,935 A | 5/1998 | Porter et al. |
| 5,849,136 A | 12/1998 | Mintz et al. |
| 6,155,202 A | 12/2000 | Nakano et al. |

FOREIGN PATENT DOCUMENTS

| | | |
|---|---|---|
| GB | 2 012 097 | 7/1979 |
| JP | 11-162 696 | 6/1999 |
| JP | 2000-315 682 | 11/2000 |
| WO | WO 93/05630 | 3/1993 |
| WO | WO 01/61727 | 8/2001 |

* cited by examiner

*Primary Examiner*—David Vu
(74) *Attorney, Agent, or Firm*—Pillsbury Winthrop LLP

(57) ABSTRACT

An electrode assembly for supplying RF power from a RF power source having an output impedance to an electrically non-linear medium, the assembly being composed of: a drive electrode in communication with the medium and forming with the medium a load impedance; and an impedance match network coupled between the RF power source and the drive electrode for matching the output impedance of the RF source to the load impedance. The match network has an output component that is directly connected to the drive electrode. The electrode assembly can further have a body of RF energy absorbing material disposed between the match network and the drive electrode, the absorbing material having a frequency dependent energy absorption characteristic which increases with frequency.

15 Claims, 2 Drawing Sheets

CLOSE COUPLED MATCH STRUCTURE FOR RF DRIVE ELECTRODE

This is a Continuation of International Application No. PCT/US01/24571, which was filed Aug. 7, 2001, which, in turn, claims benefit from Provisional U.S. Application No. 60/227,743, which was filed Aug. 17, 2000, the contents of both of which are expressly incorporated herein by reference.

BACKGROUND OF THE INVENTION

The present invention relates to systems for supplying radio frequency (RF) power to a drive electrode, particularly in a plasma reactor.

Manufacturers of equipment used by integrated circuit (IC) fabricators face a constant demand to improve the performance of their equipment. One particular type of equipment that is widely used is the plasma reactor, which is used to remove material from, or deposit material on, a semiconductor wafer. The performance of such equipment depends on coupling energy efficiently to electrodes in the reactor.

One of the key factors that determine the yield and overall quality of an IC is the uniformity of processes, such as the etch rate in vias and trenches, on the wafer. In plasma reactors, the uniformity of a process across the surface of a wafer is governed by the design of the overall system. Uniformity is typically compromised due to generation within the plasma of harmonics of the RF drive frequency because the plasma is electrically a non-linear medium, i.e., the impedance of the plasma varies as a non-linear function of electric field intensity. Significant levels of power can be generated at harmonics as high as the twentieth. These harmonics result in standing RF waves at the harmonic frequencies on the drive electrode and in the RF feed system between the driving electrode and the RE matching network, which in turn leads to plasma non-uniformities and consequent process non-uniformities across the surface of the wafer.

In a capacitively coupled plasma reactor, power from an RF power source is supplied to a drive electrode via an impedance match network. Such a reactor may have a plurality of RF drive electrodes and RF feed systems. The discussion that follows is applicable to each RF drive electrode, but for simplicity only one such RF drive system is considered below. Similarly, the invention is applicable to each RF drive system of a multi-electrode or segmented electrode drive structure. The harmonic components are generated within the plasma and propagate from the drive electrode back to the match network and the RF power source. The harmonic components are then typically reflected back to the drive electrode and standing waves at the harmonic frequencies are thereby created.

BRIEF SUMMARY OF THE INVENTION

The invention provides an improved electrode assembly for supplying RF power from an RF power source having an output impedance to an electrically non-linear medium, the assembly including: a drive electrode in communication with the medium and forming with the medium a load impedance; and an impedance match network connected between the RF power source and the drive electrode for matching the output impedance of the RF source to the load impedance and having an output component connected directly to the drive electrode.

The electrode assembly according to the invention can further include a body of RF energy absorbing material disposed between the match network and the drive electrode, the absorbing material having a frequency dependent energy absorption characteristic which increases with frequency. The provision of a body of RF energy absorbing material will improve process uniformity.

DETAILED DESCRIPTION OF THE INVENTION

Figure 1:
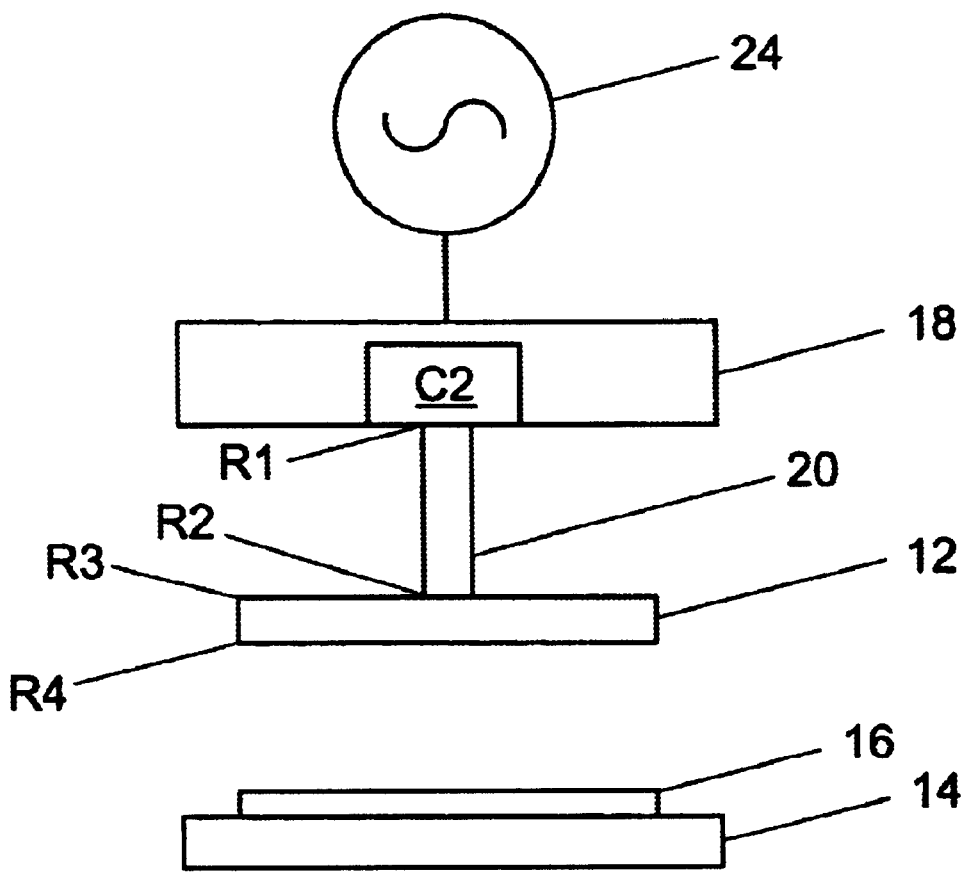
FIG. 1 is a side elevational view showing the basic components of a prior art electrode system for a plasma reactor.

A conventional plasma reactor electrode assembly is shown in FIG. 1. This assembly will be disposed in a processing chamber (not shown) that encloses a plasma generating region in which a plasma will be created. The electrode assembly consists of an upper, or drive, electrode 12, a lower electrode 14 supporting a wafer 16 to be processed, a match network 18 having a capacitor C2 which constitutes the output component of the match network, and a cylindrical conductor 20 connected between the output side, or plate, of capacitor C2 of match network 18 and upper electrode 12. RF power is supplied to match network 18 from a RF power source 24 and is then delivered to upper electrode 12 via conductor 20. RF power is coupled from upper electrode 12 into the plasma generating region to create the plasma.

Typically, cylindrical conductor 20 has a length of approximately 5 inches and a diameter smaller than the diameter of the output plate of capacitor C2. At RF frequencies, current flow, and hence power flow, takes place along the surface of conductors due to the skin effect. In the illustrated structure, this will occur along upper electrode 12 and cylindrical conductor 20. Thus, at the fundamental frequency, RF power flows from match network 18, over the surface of the cylindrical conductor 20, radially outwardly along the upper surface of upper electrode 12, downwardly along the outer cylindrical surface of electrode 12, radially inwardly along the lower surface of electrode 12, and then from the lower surface of electrode 12 into the plasma.

Applicant has determined that there are four relatively well-defined discontinuities R1, R2, R3 and R4 along the RF power flow path, and the result is that reflections at the RF fundamental frequency occur at these four discontinuities. In addition, along the lower surface of electrode 12 the plasma presents a distributed discontinuity to the flow of the RF power at the fundamental frequency; so distributed reflections will, in general, occur along the lower surface of the electrode. Consequently, a standing wave at the RF fundamental frequency exists in the feed system between match network 18 and the plasma.

Match network 18 is designed to compensate for these reflections at the fundamental frequency and to couple power at the fundamental frequency efficiently into the plasma. However, power at harmonics of the fundamental frequency is generated in the plasma and flows along the surfaces of the structure described above from the plasma toward the RF matching network. The discontinuities identified above reflect the RF power at the harmonic frequencies back toward the plasma and cause standing RF waves at the harmonic frequencies to exist on electrode 12.

Because the harmonics have shorter wavelengths than the fundamental frequency, harmonic frequency standing waves have a more deleterious effect on processing uniformity than does the fundamental frequency standing wave. The result is that process (e.g., etch or deposition) uniformity decreases due to the harmonic frequency standing waves.

The present invention is embodied in an apparatus that effectively eliminates one of the RF discontinuities, R1 in FIG. 1, in the drive electrode assembly of a plasma reactor. The invention provides two modifications of the known drive electrode assembly: (a) conductor 20 described above is entirely eliminated; and (b) a body 40 of absorber material in the form of a disk is installed upon the RF drive electrode.

The elimination of conductor 20 essentially eliminates the frequency dependence of the relationship between the reflections at the two ends of the conductor. Such frequency dependence in the prior art makes the elimination of reflections at all harmonics of the RF drive frequency difficult to realize.

The absorber material has a low absorption at the fundamental RF frequency, but a much greater absorption at all harmonic frequencies. This property of the absorbing material contributes significantly to the improvement provided by the present invention.

Figure 2:
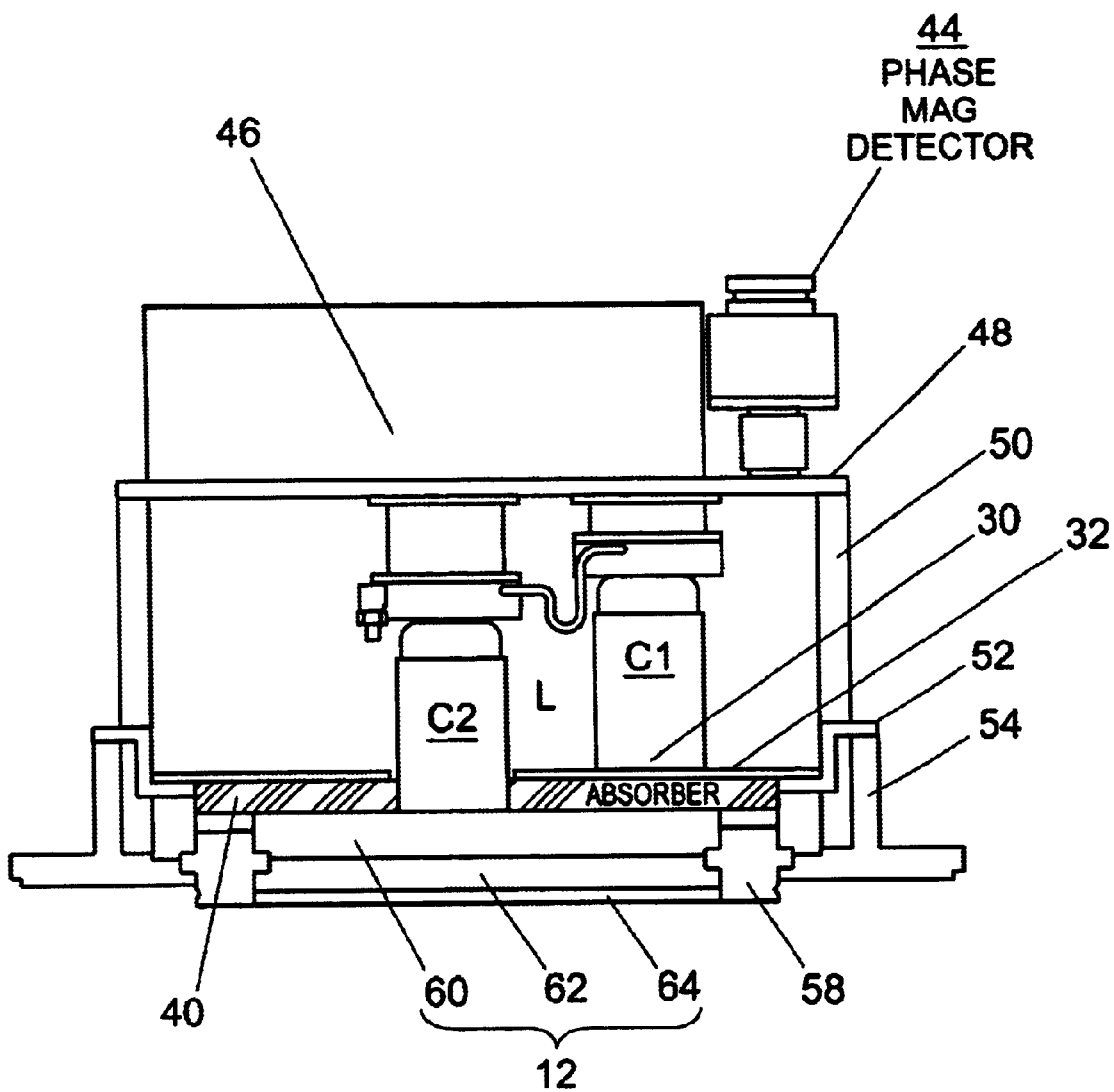
FIG. 2 is a side elevational view, with housing parts broken away, of a portion of an electrode system, showing a preferred embodiment of the invention.

FIG. 2 shows the upper portion of a plasma reactor including upper electrode 12 (for example, comprising elements 60. 62 and 64) and a match network composed of capacitors C1 and C2 and an inductor L, interconnected in a conventional manner. The upper plate (not shown) of capacitor C1 is connected to a conventional RF power source (not shown in detail) and to one end of inductor L. The lower plate 30 of capacitor C1 is connected to a plate 32 which is at ground potential. The other end of inductor L is connected to the upper plate (not shown) of capacitor C2. The lower plate of capacitor C2 constitutes the output terminal of the match network and is conductively connected directly to the upper surface of electrode 12. Typically, capacitor C2 has a cylindrical form and is composed of a body of dielectric material sandwiched between two conductive plates, all of these components being of cylindrical form. The lower plate of capacitor C2 can be connected to the upper surface of plate 12 by a suitable connecting plate bolted to plate 12.

The structure shown in FIG. 2 further includes a conventional Phase-mag detector 44, used for monitoring the forward and reflected RF power for a match network 46 having a grounded shield cover. Structural components 48 and 50 form part of the match network structure. A conductive mating piece 52 joins the match network to a top portion 54 of the plasma reactor chamber wall, piece 52 and the chamber wall being grounded. Electrode 12 is electrically isolated from the chamber wall by an insulator ring 58.

In an alternate embodiment, upper electrode 12 is composed of a main electrode body 60 and an electrode plate 62, both of which may be made of aluminum, and a silicon electrode facing 64. In accordance with conventional practice in the art, plate 62 and facing 64 are provided with gas injection holes forming a showerhead structure. Components 60–64 may be constructed according to principles already known in the art.

Absorber body 40 is in the form of a disc having a central aperture that receives the lower part of output capacitor C2 of the RF match network.

Absorber body 40 can have a portion which extends below the upper surface of electrode 12 at the periphery thereof, as shown.

Exemplary RF absorber materials having the desired energy absorbing characteristic are members of the ECCOSORB® CR castable resin family, marketed by Emerson & Cuming Microwave Products, Inc. of 869 Washington St., Ste 1, Canton, Mass. 02021. These absorber materials comprise epoxy resins loaded with iron powder and have very low loss at frequencies below 100 MHz, and progressively higher attenuation as frequency increases beyond this value. The family includes more than a dozen types of absorber resins, with varying levels of RF attenuation. One example of an ECCOSORB® material that could be used in the present invention is a castable absorber sold under the product designation CR-117. RF absorbers suitable for the purposes of this invention are considered in more detail in U.S. Provisional Application No. 60/182,187 of Windhorn et al., entitled METHOD AND DEVICE FOR ATTENUATING HARMONICS IN SEMICONDUCTOR PLASMA PROCESSING SYSTEMS, filed Feb. 14, 2000, the disclosure of which is incorporated herein by reference.

In one practical embodiment of the invention, which has been built and tested, absorber body 40 made of CR-117 has a diameter of 13.5 inches and a thickness of 1 inch. Test operations performed with this system showed departures from uniformity reduced to approximately 3%, but a need to increase power to maintain a given etch rate. It is anticipated that the system is amenable to engineering refinements that will reduce this power penalty.

Thus, one significant feature of this invention is the use of a body of a frequency dependent absorber material inside the plasma reactor electrode assembly to reduce the amount of reflected RF power at the harmonic frequencies that returns to the plasma. This body of absorber material effectively absorbs RF energy at all harmonics of the fundamental RF drive frequency for which appreciable power is observed in the absence of the absorber, but does not appreciably absorb energy at the fundamental RF drive frequency.

Absorber body 40 disk can be cast in a plurality of segments to facilitate installation in and removal from the plasma processor. This feature is of practical importance because lower plate of C2 and a number of cooling tubes, etc. must pass through the opening, or possibly through additional openings in absorber body 40.

Absorber body 40 can also be used in a structure of the type shown in FIG. 1, where it will reduce the amount of reflected RF power at the harmonic frequencies that returns to the plasma.

Another significant feature of the invention is the reduction in the physical size of a plasma reactor apparatus with a drive electrode assembly due to elimination of a conductor connecting the output capacitor of the RF match network to the drive electrode. With the industry moving to 300 mm wafer processes, such size reductions can be significant.

One advantage of this invention is that it effectively reduces the number of reflection points by one, specifically reflection point R1 in FIG. 1, which effectively eliminates the frequency dependence of the relationship between any reflections occurring at one end of that conductor in the prior art.

Another advantage of this invention is that the user can switch to different materials for use in the absorber disk very easily.

While the description above refers to particular embodiments of the present invention, it will be understood that many modifications can be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An electrode assembly for supplying RF power from an RF power source having an output impedance to an electrically non-linear medium, said assembly comprising:

a drive electrode in communication with the medium and forming with the medium a load impedance; and an impedance match network coupled between the RF power source and said drive electrode for matching the output impedance of the RF source to the load impedance, said match network having an output component that is directly connected, physically and electrically, to said drive electrode.

2. The electrode assembly of claim 1 further comprising a body of RF energy absorbing material disposed between said match network and said drive electrode, said absorbing material having a frequency dependent energy absorption characteristic which increases with frequency.

3. The electrode assembly of claim 2 wherein said absorbing material has relatively low absorption at the fundamental frequency of RF power and relatively higher absorption at harmonics of the fundamental frequency.

4. The electrode assembly of claim 2 wherein said body of RF energy absorbing material has a thickness of the order of one inch.

5. The electrode assembly of claim 4 wherein said absorbing material is an epoxy resin loaded with iron powder.

6. The electrode assembly of claim 1 wherein said output component of said match network is a capacitor having a conductive plate connected to said drive electrode.

7. The electrode assembly of claim 6 wherein said conductive plate has a cylindrical form.

8. A plasma reactor comprising a chamber enclosing a plasma region and an electrode assembly according to claim 1 disposed in said plasma region.

9. The reactor of claim 8 further comprising a wafer support constituting a second electrode disposed in said plasma region.

10. An electrode assembly for supplying RF power from an RF power source having an output impedance to an electrically non-linear medium, said assembly comprising:

a drive electrode in communication with the medium and forming with the medium a load impedance;

an impedance match network coupled between the RF power source and said drive electrode for matching the output impedance of the RF source to the load impedance; and a body of RF energy absorbing material disposed between said match network and said drive electrode, said absorbing material having a frequency dependent energy absorption characteristic which increases with frequency.

11. The electrode assembly of claim 10 wherein said absorbing material has relatively low absorption at the fundamental frequency of RF power and relatively higher absorption at harmonics of the fundamental frequency.

12. The electrode assembly of claim 11 wherein said body of RF energy absorbing material has a thickness of the order of one inch.

13. The electrode assembly of claim 12 wherein said absorbing material is an epoxy resin loaded with iron powder.

14. A plasma reactor comprising a chamber enclosing a plasma region and an electrode assembly according to claim 10 disposed in said plasma region.

15. The reactor of claim 14 further comprising a wafer support constituting a second electrode disposed in said plasma region.

* * * * *